(12) United States Patent
Enright

(10) Patent No.: US 12,435,930 B2
(45) Date of Patent: Oct. 7, 2025

(54) COOLING APPARATUS

(71) Applicant: Nokia Technologies Oy, Espoo (FI)

(72) Inventor: Ryan Enright, Floral Park, NY (US)

(73) Assignee: Nokia Technologies Oy, Espoo (FI)

( * ) Notice: Subject to any disclaimer, the term of this patent is extended or adjusted under 35 U.S.C. 154(b) by 344 days.

(21) Appl. No.: 17/918,243

(22) PCT Filed: Mar. 30, 2021

(86) PCT No.: PCT/EP2021/058241
§ 371 (c)(1),
(2) Date: Oct. 11, 2022

(87) PCT Pub. No.: WO2021/209256
PCT Pub. Date: Oct. 21, 2021

(65) Prior Publication Data
US 2023/0145696 A1    May 11, 2023

(30) Foreign Application Priority Data
Apr. 15, 2020  (EP) ................................ 20169623

(51) Int. Cl.
| F28D 15/00 | (2006.01) |
| F28D 15/02 | (2006.01) |
| F28D 15/04 | (2006.01) |
| H05K 7/20  | (2006.01) |
| F28D 21/00 | (2006.01) |

(52) U.S. Cl.
CPC ......... F28D 15/04 (2013.01); F28D 15/0275 (2013.01); H05K 7/2029 (2013.01); H05K 7/20309 (2013.01); H05K 7/20336 (2013.01); *F28D 2021/0028* (2013.01); *F28D 2021/0064* (2013.01)

(58) Field of Classification Search
CPC ................. F28D 15/04; F28D 15/0275; F28D 2021/0028; F28D 2021/0064; H05K 7/2029; H05K 7/20309; H05K 7/20336
USPC ........................................................ 361/699
See application file for complete search history.

(56) References Cited

U.S. PATENT DOCUMENTS

| 5,545,966 A | * | 8/1996 | Ramos ..................... B60L 53/34 |
| | | | 320/108 |
| 2017/0185112 A1 | * | 6/2017 | Magi ........................ G06F 1/20 |
| 2020/0080791 A1 | * | 3/2020 | Yokoyama .............. F28D 15/04 |

FOREIGN PATENT DOCUMENTS

| DE | 102011086873 A1 * | 5/2013 | ............. B25H 3/006 |
| EP | 0651404 A1 | 5/1995 | |
| EP | 3255358 A1 | 12/2017 | |

* cited by examiner

*Primary Examiner* — Zhengfu J Feng
(74) *Attorney, Agent, or Firm* — McCarter & English, LLP

(57) ABSTRACT

The application relates to a charging apparatus for inductively charging a separate, mobile apparatus. The charging apparatus includes a cooling system which is configured to enable additional phase change cooling of the mobile apparatus during inductive charging. The charging apparatus includes a flow path for providing a flow path for a phase-change cooling fluid to an interface with the mobile apparatus. The flow path enables cooling of, at least part of, the mobile apparatus when the mobile apparatus is being inductively charged by the charging apparatus. The flow path also includes wick structures that enable the phase-change fluid to be transported via capillary action.

18 Claims, 3 Drawing Sheets

COOLING APPARATUS

CROSS REFERENCE TO RELATED APPLICATION

Figure 1:
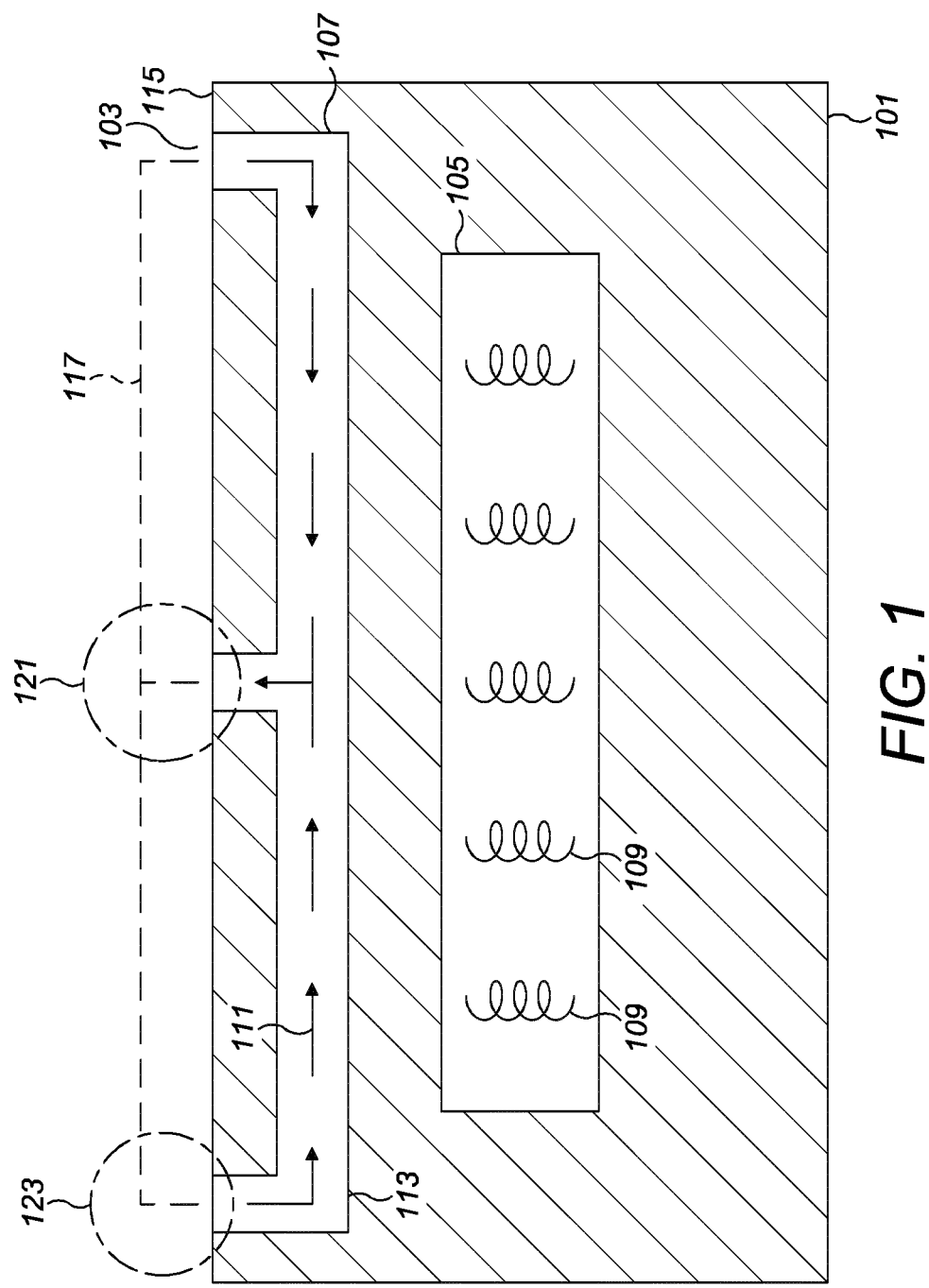

This patent application is a U.S. National Stage application of International Patent Application Number PCT/EP2021/058241 filed Mar. 30, 2021, which is hereby incorporated by reference in its entirety, and claims priority to EP 20169623.4 filed Apr. 15, 2020.

TECHNOLOGICAL FIELD

Embodiments of the present disclosure relate to cooling apparatus. Some relate to cooling apparatus for cooling mobile electronic apparatus during contactless charging.

BACKGROUND

Contactless charging of a mobile electronic apparatus can lead to unwanted to heat being generated at the mobile electronic apparatus. As charging rates increase this may increase the amount of unwanted heat that is generated. This can be problematic for the apparatus being charged as the excess heat could lead to damage of the battery or other components of the mobile electronic apparatus.

BRIEF SUMMARY

According to various, but not necessarily all, examples of the disclosure there is provided charging apparatus comprising: charging means for inductively charging a separate, mobile apparatus; flow path means for providing a flow path for a phase-change cooling fluid to an interface with the mobile apparatus so as to enable cooling of, at least part of, the mobile apparatus when the mobile apparatus is being inductively charged by the charging means; and wherein the flow path means comprises wick structures that enable the phase-change fluid to be transported via capillary action.

The charging apparatus may comprise evaporator means for enabling evaporation of the phase-change cooling fluid wherein the evaporator means are provided at the interface with the mobile apparatus so as to enable cooling of, at least part of, the mobile apparatus.

The evaporator means may comprise one or more porous protrusions.

The evaporator means may comprise an electrically insulating material.

The evaporator means may enable the phase-change cooling fluid to be evaporated into the atmosphere.

The charging apparatus may comprise storage means for storing the phase-change cooling fluid.

The storage means may comprise a capillary structure.

The charging apparatus may comprise condenser means for condensing phase-change cooling fluid from the atmosphere to enable the condensed phase-change cooling fluid to be provided to the flow path.

The condenser means may comprise at least one of thermoelectric heat pump, electrocaloric heat pump.

The condenser means may be thermally coupled to a heat distributor means for directing heat away from the condenser means.

The charging apparatus may comprise filter means for filtering phase-change cooling fluid condensed out of the atmosphere.

The charging apparatus may comprise a plurality of separate flow path means for providing flow paths for the phase-change cooling fluid when the charging apparatus is in different orientations.

The phase-change cooling fluid may comprise distilled water.

The apparatus may comprise cleaning means for cleaning the flow path means.

The charging means may comprise one or more induction coils.

According to various, but not necessarily all, examples of the disclosure there is provided charging apparatus comprising: charging circuitry configured to inductively charge a separate, mobile apparatus; one or more flow paths configured to provide a flow path for a phase-change cooling fluid to an interface with the mobile apparatus so as to enable cooling of, at least part of, the mobile apparatus when the mobile apparatus is being inductively charged by the charging circuitry; and wherein the one or more flow paths comprise wick structures that enable the phase-change fluid to be transported via capillary action.

The charging apparatus may comprise evaporators configured to enable evaporation of the phase-change cooling fluid wherein the evaporator means are provided at the interface with the mobile apparatus so as to enable cooling of, at least part of, the mobile apparatus.

The charging apparatus may comprise storage configured to store the phase-change cooling fluid.

The charging apparatus may comprise one or more condensers configured to condense phase-change cooling fluid from the atmosphere to enable the condensed phase-change cooling fluid to be provided to the flow path.

The charging apparatus may comprise one or more filters configured to filter phase-change cooling fluid condensed out of the atmosphere.

According to various, but not necessarily all, examples of the disclosure there is provided a system comprising a charging apparatus as described above and at least one mobile apparatus configured to be charged by the charging apparatus.

According to various, but not necessarily all, examples of the disclosure there is provided a mobile apparatus comprising flow path means configured to receive phase-change cooling fluid from a charging apparatus.

The flow path means within the mobile apparatus may provide a flow path for phase-change cooling fluid from an interface with the charging apparatus to another location within the mobile apparatus. The another location may be a thermally critical location.

The flow path means within the mobile apparatus may comprise a wick structure

BRIEF DESCRIPTION

Figure 2:
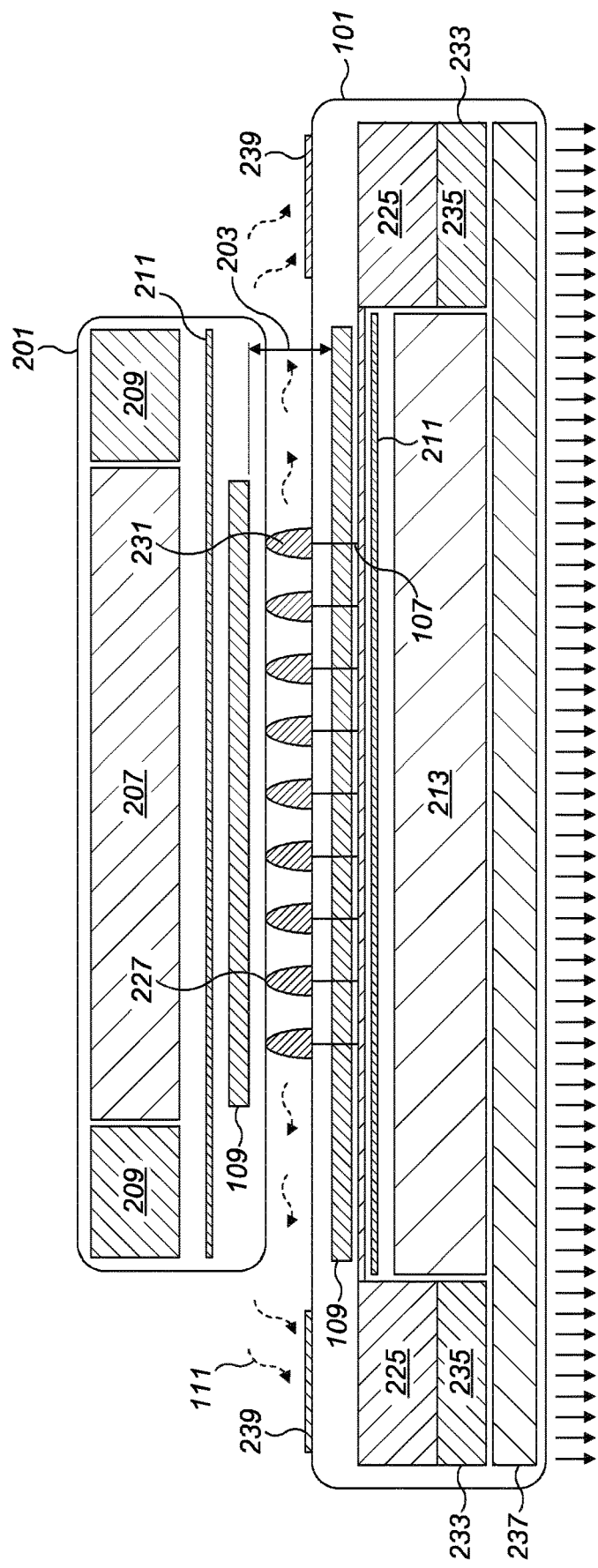
Figure 3:
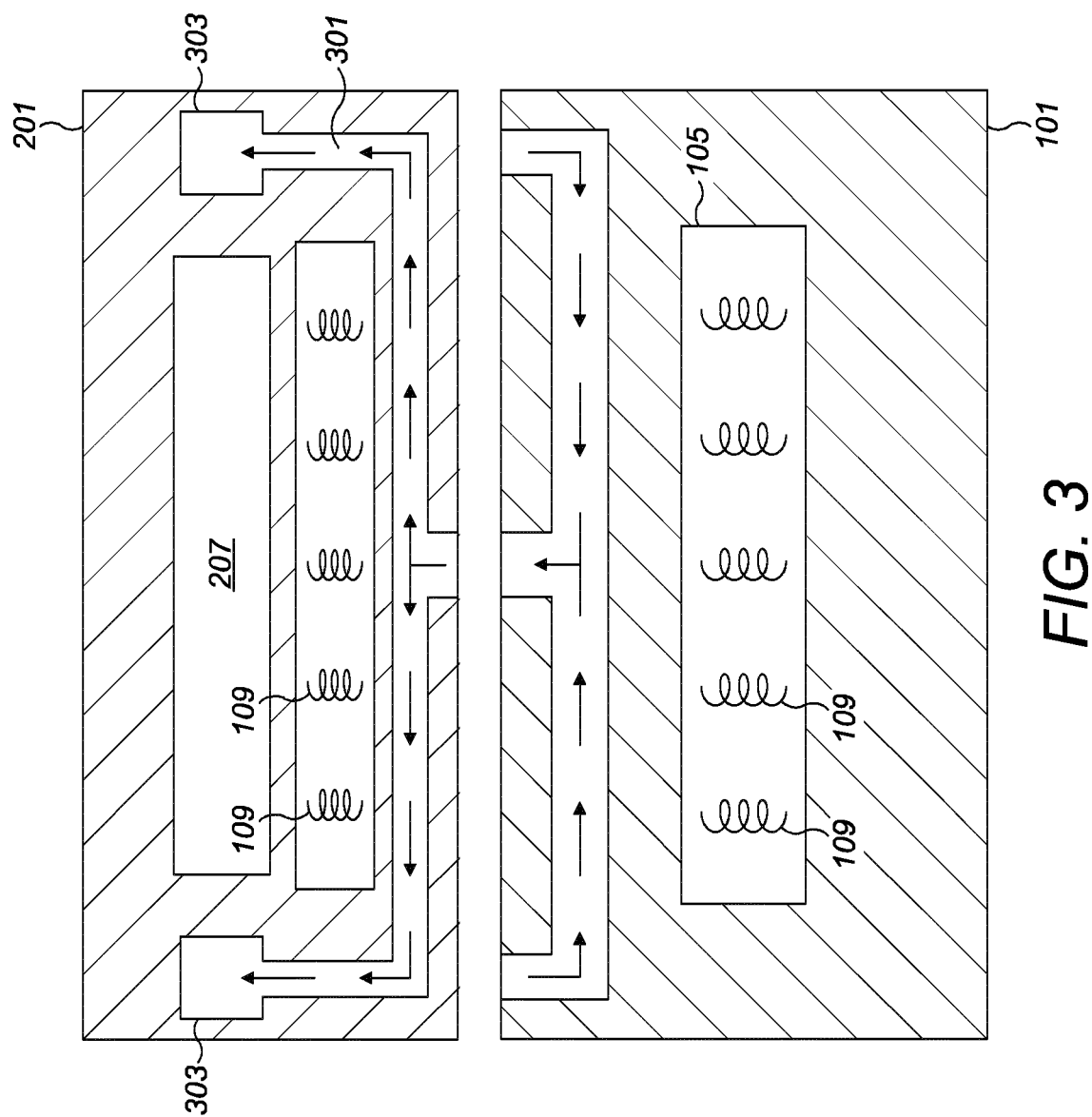

Some examples will now be described with reference to the accompanying drawings in which:

FIG. 1 shows an example apparatus;
FIG. 2 shows another example apparatus; and
FIG. 3 shows an example system.

DETAILED DESCRIPTION

Examples of the disclosure relate to a charging apparatus 101 for inductively charging a separate, mobile apparatus 201. The charging apparatus 101 comprises a cooling system 103 which is configured to enable additional phase change cooling of the mobile apparatus 201 during inductive charging.

FIG. 1 shows an example charging apparatus 101 according to examples of the disclosure. The example charging apparatus 101 comprises charging means 105 and flow path means 107. Only features referred to in the following description are shown in FIG. 1 it is to be appreciated that the charging apparatus 101 could comprise additional features in other examples of the disclosure.

The charging means 105 may comprise any means which enable inductive charging of a separate, mobile apparatus when the mobile apparatus is positioned close to the charging apparatus 101. In some examples the charging means 105 may comprise one or more induction coils 109. The induction coils 109 may enable charging of the mobile apparatus by near-field inductive power transfer.

When the mobile apparatus is being charged it is positioned adjacent to the charging apparatus 101 so that a corresponding induction coil within the mobile apparatus can receive power from the induction coils 109 in the charging apparatus 101. In the example of FIG. 1 the mobile apparatus can be positioned on, or adjacent to, a surface 115 of the charging apparatus 101.

The charging apparatus 101 also comprises a flow path means 107. The flow path means 107 comprises any means which enables a phase-change cooling fluid 111 to be transported from one part of the charging apparatus 101 to another part. The flow path means 107 provides a flow path for the phase-change cooling fluid 111. In some examples the flow path means 107 comprise a conduit for the phase-change cooling fluid 111 within the charging apparatus 101.

The phase-change cooling fluid 111 comprises any suitable material which can undergo a phase change when it is transported to a position close to a charging mobile apparatus. In some examples the phase-change cooling fluid 111 can comprise distilled water. The distilled water has a large latent heat of vaporization which makes it suitable for use in the cooling system. Distilled water also has a high surface tension but low viscosity which enables if to flow through the wick structure by capillary action. Distilled water is also easily obtainable in that it can be condensed out of the atmosphere.

The flow path means 107 comprises wick structures. The wick structures extend for at least a portion of the flow path means 107. The flow path means can comprise some portions that comprise wick structures and some portions that don't comprise wick structures. The wick structures comprise a plurality of capillary channels that enable phase-change cooling fluid 111 to be transported along the flow path means 107 via capillary action. The capillary action may enable the phase-change cooling fluid 111 to be transported to the interface with the mobile apparatus.

The interface with the mobile apparatus can comprise a region where the charging apparatus 101 contacts the mobile apparatus so as to enable inductive charging of the mobile apparatus. In some examples parts of the charging apparatus such as one or more evaporator structures can contact the mobile apparatus. In some examples a gap can be provided between the mobile apparatus and the charging apparatus at the interface.

In the example shown in FIG. 1 the flow path means 107 is provided close to the surface 115 of the charging apparatus 101. This helps to bring the phase-change cooling fluid 111 close to the mobile apparatus during use of the charging apparatus 101 and so helps to cool the mobile apparatus. The flow path means 107 is configured to transport the phase-change cooling fluid 111 to an interface with the mobile apparatus. In the example of FIG. 1 the flow path means 107 is configured to transport the phase-change cooling fluid 111 to the surface 115 of the charging apparatus 101. The surface 115 can provide an interface with the mobile apparatus.

In some examples the flow path means 107 can be configured so that, during use, the phase-change cooling fluid 111 is brought into direct contact with the mobile apparatus 101. For instance, the phase-change cooling fluid 111 could be brought into contact with one or more surfaces of the mobile apparatus. In some exampled the flow path means 107 may enable the phase-change cooling fluid 111 to be transferred into a corresponding flow path means within the mobile apparatus.

The charging apparatus 101 can comprise one or more evaporator means which enable the phase-change cooling fluid 111 to be evaporated into the atmosphere. The evaporator means are coupled to the flow path means 107 so that phase-change cooling fluid 111 can flow from the flow path means 107 through the evaporator means and into the atmosphere. In other examples the flow path means 107 can comprise a closed circuit which retains the phase-change cooling fluid 111 within the flow path means 107. In such examples a conduit may be provided from the interface with the mobile apparatus back to the flow path means 107 within the charging apparatus 101.

The flow path means 107 is positioned within the charging apparatus 101 so that it does not interfere with the charging means 105. The flow path means 107 can be configured so that the flow path means 107 does not intersect any of the coils 109 within the charging means 105.

When the charging apparatus 101 is in use a mobile apparatus is positioned adjacent to the surface 115 of the charging apparatus 101 so that power can be transferred from the charging means 105 to a corresponding charging means in the mobile apparatus. This inductive charging generates heat at the interface between the charging apparatus 101 and the mobile apparatus.

The heat generated by the charging process creates an evaporator region 121 at the interface between the charging apparatus 101 and the mobile apparatus. At the evaporator region 121 heat generated by the charging process causes the phase-change cooling fluid 111 to evaporate and change phase from a liquid to a gas. The phase-change cooling fluid 111 in the gas phase will then flow to a region of lower vapour pressure and/or concentration and so will transfer heat away from the interface region and provide cooling to the mobile apparatus.

In the example shown in FIG. 1 the evaporated phase-change cooling fluid 111 can flow into the ambient surroundings around the charging apparatus 101 as shown by the dotted lines 117. In the example of FIG. 1 the charging apparatus 101 also comprises a condenser region 123 which enables the phase-change cooling fluid 111 to be re-circulated back into the flow path means 105 after it has evaporated at the evaporator region 121. The condenser region 123 has a cooler temperature than the evaporator region 121. The cooler temperature of the condenser region 123 causes the phase-change cooling fluid 111 to condense into the liquid phase. In such examples the charging apparatus 101 can comprise a heat pump or any other suitable means to maintain the condenser region 123 at the lower temperature. In some such examples the charging apparatus 101 can also comprise a storage means for storing the phase-change cooling fluid 111 after it has been condensed from the atmosphere.

In other examples once the phase-change cooling fluid 111 has evaporated into the atmosphere it does not re-enter the charging apparatus 101. This could occur if the charging apparatus 101 does not comprise a condenser region. This could also occur if the charging apparatus 101 is being used in surroundings which are too hot to enable the condenser region 123 to function correctly, for example, if the charging apparatus 101 is being used in a hot car. In these examples the charging apparatus 101 can comprise a storage means or reservoir for storing phase-change cooling fluid 111 for use during cooling.

In other examples the flow path means 107 can comprise one or more conduits which transfer the evaporated phase-change cooling fluid 111 back to the charging apparatus 101. In some examples one or more conduits could be provided which enables the evaporated phase-change cooling fluid 111 to be transferred into the mobile apparatus. This may enable the phase-change cooling fluid 111 to be transferred to thermally critical locations within the mobile apparatus.

FIG. 2 illustrates a charging apparatus 101 being used to charge a separate mobile apparatus 201.

The mobile apparatus 201 could be a mobile telephone, a laptop, a smart watch or any other suitable electronic mobile apparatus 201. The mobile apparatus 201 is portable so that it can be easily carried by a user. The mobile apparatus 201 is separate to the charging apparatus 101 in that it can function independently of the charging apparatus 101.

In the example shown in FIG. 2 the mobile apparatus 201 comprises one or more induction coils 109, a ferrite shield 211 a battery 207 and one or more electronic components 209. Only components of the mobile apparatus 201 that are referred to in the following description are shown in FIG. 2. It is to be appreciated that the mobile apparatus 201 could comprise additional components that are not shown in FIG. 2. For instance, the mobile apparatus 201 could comprise components such as user interfaces and transceiver means.

The battery 207 comprises means for storing electrical charge within the mobile apparatus 201. The battery 207 is configured to be charged by inductive charging. The battery 207 could be a Lithium ion battery, a Lithium polymer battery or any other suitable type of battery.

The battery 207 is configured to provide power to the electronic components 209 of the mobile apparatus 201. The electronic components 209 could comprise processors, controllers or any other suitable types of electronic components. The batter 207 provides power to the electronic components 209 so that the mobile apparatus 201 can operate independently of the charging apparatus 201.

The ferrite shield 211 is provided between the induction coils 109 and the battery 207 and electronic components 209. The ferrite shield 211 protects the battery 207 and the electronic components 209 from the electromagnetic fields in the induction coils 109.

The induction coil 109 is provided close to a surface of the mobile apparatus 201 so as to enable inductive charging of the battery 207 when the mobile apparatus 201 is positioned close to the charging apparatus 101.

The charging apparatus comprises 101 comprises charging means 105 and flow path means 107.

In the example of FIG. 2 the charging means 105 comprises an induction coil 109 that is positioned close to the surface of the charging apparatus 101.

The charging apparatus 101 also comprises a ferrite shield 211. The ferrite shield 211 is positioned between the induction coil 109 and one or more electronic components 213 of the charging apparatus 101. The ferrite shield 211 is configured to protect the one or more electronic components 213 from electromagnetic fields generated by the induction coil 109.

In the example of FIG. 2 the flow path means 107 provides a flow path from a storage means 225 to evaporator means 227.

The storage means 225 can comprise any means which are configured to store the phase-change cooling fluid 111 within the charging apparatus 101. The storage means 225 can comprise one or more reservoirs or any other suitable means. The storage means 225 can store the phase-change cooling fluid 111 in a liquid phase. In some examples the storage means 225 can comprise a capillary structure to prevent unwanted movement, or sloshing, of the phase-change cooling fluid 111 when it is in the liquid phase. Two storage means 225 are shown in the charging apparatus 101 of FIG. 2. Other numbers of storage means 225 can be provided in other examples of the disclosure.

The storage means 225 are positioned within the charging apparatus 101 and coupled to the flow path means 107 so as to enable phase-change cooling fluid 111 to flow from the storage means 225 to the flow path means 107. The phase-change cooling fluid 111 can flow from the storage means 225 to the flow path means 107 via capillary action.

The flow path means 107 provides a conduit between the storage means 225 and the evaporator means 227. The evaporator means 227 comprise means for enabling evaporation of the phase-change cooling fluid 111. The evaporator means 227 are provided on the surface 115 of the charging apparatus 101. The evaporator means 227 are positioned within the charging apparatus 101 so that, when the charging apparatus 101 is being used to charge a mobile apparatus 201, the evaporator means 227 are provided at the interface between the charging apparatus 101 and the mobile apparatus 201 so as to enable cooling of, at least part of, the mobile apparatus 201. In the example of FIG. 2 the evaporator means 229 are provided on the surface of the charging apparatus 101 so that when the mobile apparatus 201 is being charged, the evaporator means 229 is adjacent to the mobile apparatus 201.

In the example of FIG. 2 the evaporator means 229 comprises a plurality of porous protrusions 231. The porous protrusions 231 project out of the surface 115 of the charging apparatus 101. When the mobile apparatus 201 is positioned for charging the porous protrusions 231 contact a surface of the mobile apparatus 201. The height of the porous protrusions 231 ensures that an air gap 203 is provided between the mobile apparatus 201 and the charging apparatus 101.

The porous protrusions 231 have a pore size that is smaller than the diameter of the wick structure within the flow path means 107. This ensures that, as phase-change cooling fluid 111 is evaporated from the porous protrusions 231 the phase-change cooling fluid 111 is transported from the storage means 225 to the porous protrusions 231.

The porous protrusions 231 of the evaporator means 227 can comprise any suitable material. In some examples the porous protrusions 231 can comprise an electrically insulating material so as not to interfere with the inductive charging process.

The porous protrusions 231 can be provided in any suitable configuration. In the examples shown in FIG. 2 the porous protrusions 231 are spaced from each other so that there are gaps between the porous protrusions 231. The gaps provide, at least partially, a route for the evaporated phase-change cooling fluid 111 so as to enable the evaporated phase-change cooling fluid 111 to flow away from the porous protrusions 231 and facilitate the transfer of heat away from the mobile apparatus 201.

In the example shown in FIG. 2 the evaporator means 227 is configured to enable the phase-change cooling fluid 111 to be evaporated into the atmosphere. In other examples the flow path means 107 could comprise a closed loop and the evaporator means 227 could enable the phase-change cooling fluid 111 to be evaporated into a conduit which returns the phase-change cooling fluid 111 to the storage means 225. In other examples the evaporator means 227 could be configured to enable the phase-change cooling fluid 111 to be provided into a conduit within the mobile apparatus 201 itself. This could allow for transfer of the phase-change cooling fluid 111 from the charging apparatus 101 to the mobile apparatus 201.

In the example of FIG. 2 the charging apparatus 101 comprises condenser means 233 for condensing phase-change cooling fluid 111 from the atmosphere. In the example shown in FIG. 2 this enables the phase-change cooling fluid 111 to circulate from the evaporator means 227 back into the storage means 225 and flow path means 109, In the example of FIG. 2 the condenser means 233 comprises a heat pump 235. The heat pump 235 is positioned adjacent to the storage means 225. The heat pump 235 helps to maintain the storage means 225 at a lower temperature than the evaporator means 227. This helps to maintain the phase-change cooling fluid 111 in a liquid state and ensures that the phase-change cooling fluid 111 flows from the storage means to the evaporator means 227.

The heat pump 235 can comprise any means for transferring heat from the storage means 225 to a heat distributor means 237 or other thermal reservoir. The heat pump 235 could comprise a thermoelectric heat pump, electrocaloric heat pump or any other suitable type of heat pump.

The condenser means 233 is thermally coupled to the heat distributor means 237 for directing heat away from the condenser means 233. The heat distributor means 237 can comprise a metal, a graphite-based material, a low-profile vapor chamber, an oscillating heat pipe, or any other suitable means. The heat distributor means 237 may enable heat to be transferred to a substrate that the charging apparatus 101 is mounted on or to any other suitable location.

In the example of FIG. 2 the charging apparatus 201 also comprises filter means 239. The filter means 239 for filtering phase-change cooling fluid 111 condensed out of the atmosphere. In the example of FIG. 2 the filter means 239 are provided at an inlet to the storage means 225. The filter means 239 help to prevent impurities from entering the storage means 225 and flow path means 107.

FIG. 3 shows another example embodiment. In this embodiment the charging apparatus 101 can be as shown in FIG. 1 and the mobile apparatus 201 comprises flow path means 301 within the mobile apparatus 201.

The flow path means 301 within the mobile apparatus 201 provide a flow path for phase-change cooling fluid 111 from the interface with the charging apparatus 101 to another location within the mobile apparatus 201. The another location could be a thermally critical location such as location close to the battery 207 or a thermally sensitive electronic component.

The flow path means 301 within the mobile apparatus 201 comprises a wick structure so as to enable the phase-change cooling fluid 111 to flow though the flow path means 301 via capillary action.

The flow path means 301 couples the interface between the mobile apparatus 201 and the charging apparatus 101 with an evaporator means 303 within the mobile apparatus 201. The evaporator means 303 could comprise any structure that is configured to enable the phase-change cooling fluid 111 to be evaporated so as to transfer heat away from the region around the evaporator means 303.

In this example the interface between the charging apparatus 101 and the mobile apparatus 201 enables the phase-change cooling fluid 111 to flow from the charging apparatus 101 to the mobile apparatus 201. In some examples the charging apparatus 101 could comprise a condenser means to enable phase-change cooling fluid 111 to be condensed from the atmosphere to refill the flow path means 107 and any storage means 225 within the charging apparatus 101.

The configuration shown in FIG. 3 enables cooling of thermally critical components of the mobile apparatus 201. In other examples the phase-change cooling fluid 111 could be transferred from the charging apparatus 101 to the mobile apparatus 201 so as to enable charging of a thermal battery within the mobile apparatus 201.

It is to be appreciated that examples of the disclosure could comprise variations and modifications to the examples described above. For instance, in some examples the charging apparatus 101 can comprise cleaning means for cleaning the flow path means 107. The cleaning means could comprise titanium dioxide or any other suitable means which can act to clean the capillary structures of the flow path means 107 and porous structures 231 when exposed to ambient ultra-violet (UV) light. In some examples the cleaning means could comprise means for preventing biological growth within the flow path means 107 and porous structures 231. In these examples the cleaning means could comprise one or more light emitting diodes configured to provide UV-C light, copper particles, silver particles or any other suitable means.

In some examples the charging apparatus 101 could be configured to switch between different modes of operation. For example, the charging apparatus 101 shown in FIG. 2 can operate in a closed loop mode or in an open mode. In the closed loop mode the phase-change cooling fluid 111 is circulated from the evaporator means 227 back into the storage means 225 and flow path means 107 via the condenser means 233. In the open mode the phase-change cooling fluid 111 could be evaporated into the atmosphere and not returned to the storage means 225 or flow path means 107. The open mode could be used if the ambient temperature is too high for the condenser means 223 to operate effectively. In such examples the charging apparatus 201 could comprise sensor means for sensing the ambient temperatures. If the ambient temperature is determined to be above a threshold of operation for the condenser means 233 then the charging apparatus 101 can turn the heat pump off 235 and enable the charging apparatus 101 to operate in the open mode.

If the charging apparatus 101 is to be operated in open mode then the storage means 225 need to contain sufficient phase-change cooling fluid 111 to maintain cooling of the mobile apparatus 201 while it is being charged. As an example, if the mobile apparatus 201 has a battery 207 with an energy capacity of 40 kJ and the inductive charging is 75% efficient then an energy load of 10 kJ will need to be dissipated by the phase-change cooling fluid 111. If distilled water with a latent heat of 2, 260 kJ/kg is used this would require a mass of approximately 4.5 g of distilled water. This is similar in volume to a teaspoon.

In the examples shown the charging apparatus 101 is used in a horizontal configuration and so the phase-change cooling fluid 111 does not need to do any work against gravity as it is transported along the flow path means 107. In other examples the charging apparatus 101 could comprise a plurality of different flow path means 107 coupled to different storage means 225. The different flow path means 107 and storage means 225 can be separate from each other so that the phase-change cooling fluid 111 does not flow between the different flow path means 107 within the charging apparatus 101. The different flow path means 107 can be configured to that the phase-change cooling fluid 111 can still be transported to the interface with the mobile apparatus 201 even when the charging apparatus 101 is in a vertical orientation as this would provide lower pressures within the phase-change cooling fluid 111 as compared to a single interconnected flow path means 107.

In the examples of the disclosure the phase-change cooling fluid 111 is transported through the flow path means 107 via capillary action. In other examples a small-scale fluid pump could be provided within the charging apparatus 101 so as to assist with the transport of the phase-change cooling fluid 111.

Examples of the disclosure therefore enable cooling of a mobile apparatus 201 during indictive charging. The use of a phase-change cooling fluid 111 such as distilled water enables the heat to be transferred away from the mobile apparatus by the phase-change cooling fluid 111. Using distilled water as the phase-change cooling fluid 111 ensures that a supply of the phase-change cooling fluid 111 can be obtained from the atmosphere.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

I claim:

1. A charging apparatus, comprising:
   a charger for inductively charging a separate, mobile apparatus;
   a coolant flow path for providing a flow path for a phase-change cooling fluid to an interface with the mobile apparatus so as to enable cooling of, at least part of, the mobile apparatus when the mobile apparatus is being inductively charged by the charger;
   wick structures in the coolant flow path, the wick structures enabling the phase-change cooling fluid to be transported via capillary action; and
   an evaporator for enabling evaporation of the phase-change cooling fluid, wherein the evaporator is provided at the interface with the mobile apparatus so as to enable cooling of, at least part of, the mobile apparatus.

2. The charging apparatus as claimed in claim 1 wherein the evaporator comprises one or more porous protrusions.

3. The charging apparatus as claimed in claim 1 wherein the evaporator comprises an electrically insulating material.

4. The charging apparatus as claimed in claim 1 wherein the evaporator enables the phase-change cooling fluid to be evaporated into the atmosphere.

5. The charging apparatus as claimed in claim 1 comprising a storage for storing the phase-change cooling fluid.

6. The charging apparatus as claimed in claim 1 comprising a condenser for condensing phase-change cooling liquid from the atmosphere to enable the condensed phase-change cooling fluid to be provided to the flow path.

7. The charging apparatus as claimed in claim 6 wherein the condenser comprises at least one of a thermoelectric heat pump, or an electrocaloric heat pump.

8. The charging apparatus as claimed in claim 6 wherein the condenser is thermally coupled to a heat distributor for directing heat away from the condenser.

9. The charging apparatus as claimed in claim 6 comprising a filter for filtering phase-change cooling fluid condensed out of the atmosphere.

10. The charging apparatus as claimed in claim 1 comprising a plurality of separate flow paths for providing flow paths for the phase-change cooling fluid when the charging apparatus is in different orientations.

11. The charging apparatus as claimed in claim 1 wherein the phase-change cooling fluid comprises distilled water.

12. The charging apparatus as claimed in claim 1 wherein the apparatus comprises a cleaner for cleaning the flow path.

13. A system comprising the charging apparatus as claimed in claim 1 and the mobile apparatus configured to be charged by the charging apparatus.

14. A mobile apparatus, comprising:
flow path configured to receive phase-change cooling fluid through a wick structure by a capillary action from a charging apparatus; and
an evaporator for enabling evaporation of the phase-change cooling fluid, wherein the evaporator is provided at an interface of the flow path and the mobile apparatus so as to enable cooling of, at least part of, the mobile apparatus.

15. A charging apparatus, comprising:
a charger for inductively charging a separate, mobile apparatus;
a coolant flow path for providing a flow path for a phase-change cooling fluid to an interface with the mobile apparatus so as to enable cooling of, at least part of, the mobile apparatus when the mobile apparatus is being inductively charged by the charger;
wick structures in the coolant flow path, the wick structures enabling the phase-change cooling fluid to be transported via capillary action; and
a condenser for condensing the phase-change cooling fluid from the atmosphere to enable the condensed phase-change cooling fluid to be provided to the flow path.

16. A charging apparatus as claimed in claim 15, wherein the condenser comprises at least one of a thermoelectric heat pump, or an electrocaloric heat pump.

17. The charging apparatus as claimed in claim 15, wherein the condenser is thermally coupled to a heat distributor for directing heat away from the condenser.

18. The charging apparatus as claimed in claim 15, comprising a filter for filtering the phase-change cooling fluid condensed out of the atmosphere.

* * * * *